US008674728B2

(12) United States Patent
Sogo et al.

(10) Patent No.: US 8,674,728 B2
(45) Date of Patent: Mar. 18, 2014

(54) POWER MODULE IN WHICH PROTECTION FOR SWITCHING ELEMENT VARIES IN DEPENDENCE ON ACTIVE OPERATION OF THE SWITCHING ELEMENT

(75) Inventors: Naohiro Sogo, Fukuoka (JP); Shingo Tomioka, Fukuoka (JP); Shinichi Sunaoku, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/469,674

(22) Filed: May 11, 2012

(65) Prior Publication Data

US 2013/0063188 A1 Mar. 14, 2013

(30) Foreign Application Priority Data

Sep. 14, 2011 (JP) ................................. 2011-200710

(51) Int. Cl.
*H03K 3/00* (2006.01)

(52) U.S. Cl.
USPC ............................ 327/108; 327/112; 323/282

(58) Field of Classification Search
USPC .................... 327/108, 112; 323/282
See application file for complete search history.

(56) References Cited

U.S. PATENT DOCUMENTS

| 5,008,771 | A | 4/1991 | Palara |
| 5,731,731 | A * | 3/1998 | Wilcox et al. ................. 327/403 |
| 6,838,914 | B2 | 1/2005 | Sakata et al. |
| 6,934,140 | B1 * | 8/2005 | Rober et al. .................. 361/154 |
| 7,132,868 | B2 | 11/2006 | Sakata et al. |
| 7,154,326 | B2 * | 12/2006 | Swanson et al. .............. 327/427 |
| 7,274,223 | B2 | 9/2007 | Sakata et al. |

FOREIGN PATENT DOCUMENTS

| EP | 0 255 067 A1 | 11/1990 |
| JP | 5-275999 | 10/1993 |
| JP | 7-297697 | 11/1995 |
| JP | 2005-348429 | 12/2005 |

OTHER PUBLICATIONS

Office Action mailed Oct. 16, 2013 in German Application No. 10 2012 216 317.4 (w/partial English translation).

* cited by examiner

*Primary Examiner* — Kenneth B. Wells
(74) *Attorney, Agent, or Firm* — Oblon, Spivak, McClelland, Maier & Neustadt, L.L.P.

(57) ABSTRACT

A power module includes: a drive circuit for driving an IGBT of a semiconductor element; a protection circuit for performing operation for protection of the IGBT if the collector current of the IGBT has reached a trip level; and a control power source voltage detection circuit for detecting a control power source voltage to be supplied to the drive circuit. The protection circuit changes a sense resistor from a resistor to a series circuit with resistors and if the control power source voltage drops to a level lower than a predetermined value, thereby lowering the trip level.

7 Claims, 7 Drawing Sheets

F I G. 1
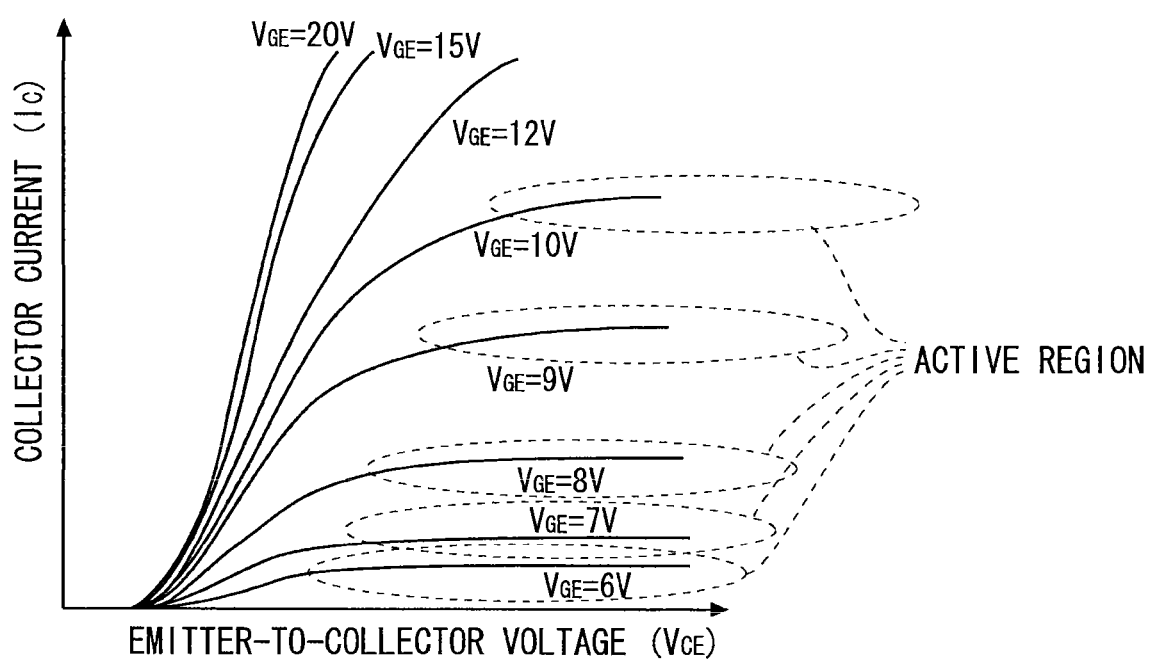

F I G. 6
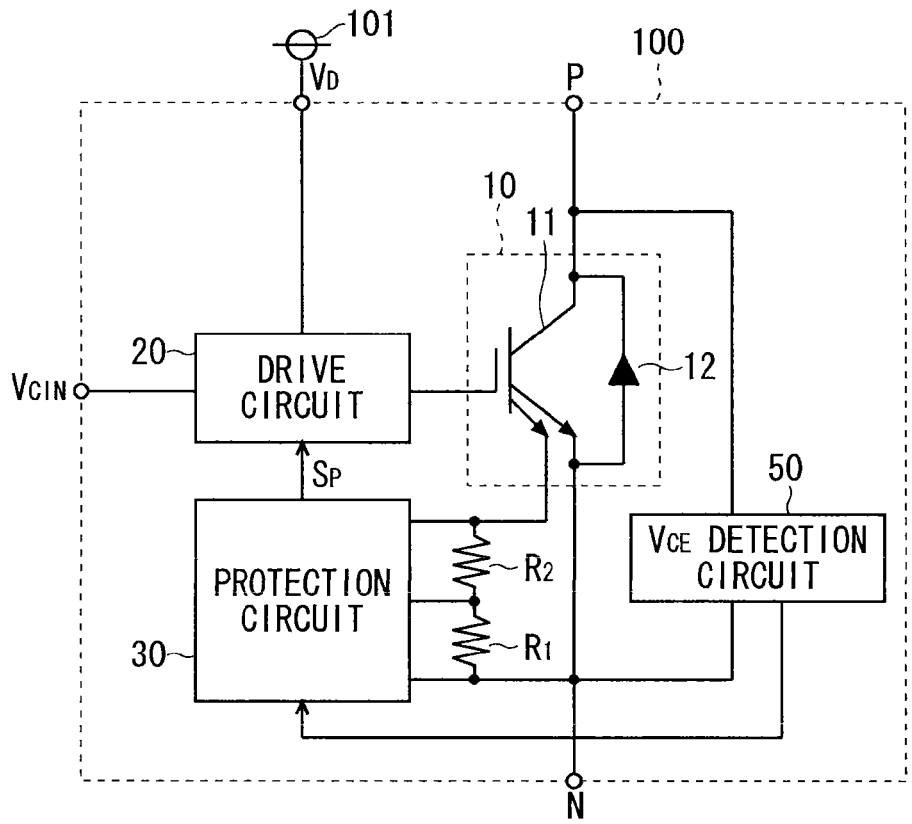
F I G. 7
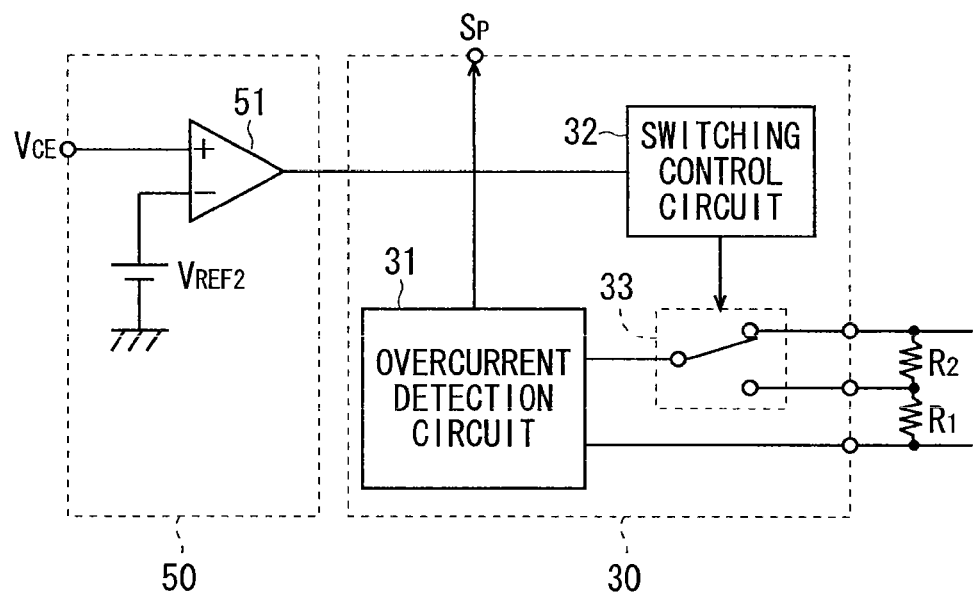

POWER MODULE IN WHICH PROTECTION FOR SWITCHING ELEMENT VARIES IN DEPENDENCE ON ACTIVE OPERATION OF THE SWITCHING ELEMENT

BACKGROUND OF THE INVENTION

1. Field of the Invention

The present invention relates to a power module used in a semiconductor device for power control, and more specifically, to a protection circuit of a semiconductor element mounted on the power module.

2. Description of the Background Art

A power module known to be used in a semiconductor device for power control has a protection function for protecting a semiconductor element such as an IGBT (insulated gate bipolar transistor) functioning as a switching element from overcurrent or a short circuit. Such a power module generally includes a resistor (sense resistor) for converting a current (sense current) flowing in a sense terminal of the semiconductor element to a voltage (sense voltage), and a protection circuit that performs predetermined operation for protection based on the sense voltage (see Japanese Patent Application Laid-Open Nos. 2005-348429 and 5-275999 (1993), for example). The protection circuit determines that a current flowing in the semiconductor element has exceeded an admissible value if the sense voltage has reached a predetermined value, and then performs operation for protection. As an example, the protection circuit stops the operation of the semiconductor element.

A power module having the conventional protection function generates fluctuations of the ratio of a sense current diverted from a main current or fluctuations of the resistance value of a sense resistor. This generates fluctuations of a current value that is what is called a "short-circuit protection trip level (SC trip level)" at which a protection circuit starts operation for protection, making it difficult to realize the operation for protection appropriately. Further, the upper limit of the current value of a semiconductor element should be changed in some cases according to the change of environment where the power module is used. The power module suggested in Japanese Patent Application Laid-Open Nos. 2005-348429 and 5-275999 that allows adjustment of the SC trip level of a protection circuit may be responsive to these problems.

In the conventional power module, if a power source voltage (control power source voltage) for controlling the semiconductor element drops for some reason, the voltage level of a drive signal for driving the semiconductor element is reduced. This causes the semiconductor element to operate easily in an active region (in the following, operation of a semiconductor element in an active region is called "active operation"). The active operation of the semiconductor element generates thermal breakdown easily due to increase of an ON voltage. If the semiconductor element is an IGBT, for example, the active operation of the IGBT increases an ON voltage (collector-to-emitter voltage) applied when a collector current flows. This generates serious thermal loss, leading to generation of thermal breakdown of the IGBT.

As already described above, in the conventional power module, an SC trip level fluctuates due to fluctuations of the ratio of a sense current diverted from a main current or fluctuations of the resistance value of a sense resistor. In particular, if the SC trip level of the power module shifts to a higher level and if the control power source voltage thereof drops, the semiconductor element performs active operation before a current flowing therein reaches the SC trip level, namely before the protection circuit works, generating a problem of thermal breakdown.

SUMMARY OF THE INVENTION

It is an object of the present invention to provide a power module capable of preventing thermal breakdown of a semiconductor element even if a control power source voltage drops.

According to a first aspect of the present invention, the power module includes a semiconductor element, a drive circuit for driving the semiconductor element, a protection circuit, an active operation detection part, and a trip level switching circuit. The protection circuit detects a main current flowing between main electrodes of the semiconductor element, and performs operation for protection of the semiconductor element if the main current has reached a trip level. The active operation detection part detects the active operation of the semiconductor element. The trip level switching circuit lowers the trip level if the active operation of the semiconductor element is detected.

According to a second aspect of the present invention, the power module includes a semiconductor element, a drive circuit for driving the semiconductor element, a protection circuit, an external power source input terminal, an internal power source, and a power source selection part. The protection circuit detects a main current flowing between main electrodes of the semiconductor element, and performs operation for protection of the semiconductor element if the main current has reached a trip level. The external power source input terminal receives an external power source voltage supplied from an external power source. The internal power source generates an internal power source voltage. The power source selection part selectively supplies the external and internal power source voltages as a control power source voltage to the drive circuit.

According to the first aspect of the present invention, the trip level is lowered if the control power source voltage drops to make the semiconductor element perform active operation. Thus, thermal breakdown due to the active operation of the semiconductor element is prevented by the operation for protection performed by the protection circuit.

According to the second aspect of the present invention, if the control power source voltage to be supplied from one of the external and internal power sources drops, a voltage to be supplied from the other one of the external and internal power sources can be given to the drive circuit. This prevents the active operation of the semiconductor element, so that thermal breakdown due to the active operation of the semiconductor element will not occur.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a graph showing relationship between a collector-to-emitter voltage $V_{CE}$ and a collector current $I_C$ of an IGBT;

FIG. 6 shows the structure of a power module of a second preferred embodiment;

FIG. 7 shows the structures of a protection circuit and a collector-to-emitter voltage detection circuit in the power module of the second preferred embodiment;

EMBODIMENT FOR CARRYING OUT THE INVENTION

First Preferred Embodiment

A problem of thermal breakdown to be generated by the active operation of a semiconductor element is described first based on the assumption that an IGBT is used as the semiconductor element is an IGBT.

FIG. 1 is a graph showing relationship between a collector-to-emitter voltage $V_{CE}$ and a collector current $I_C$ of the IGBT. The IGBT has a saturated region where the collector current $I_C$ relies on the collector-to-emitter voltage $V_{CE}$, and an active region where the collector current $I_C$ relies on a gate-to-emitter voltage $V_{GE}$ (region where the collector current $I_C$ is constant relative to the collector-to-emitter voltage $V_{CE}$).

It is seen from FIG. 1 that the IGBT operates in the active region over a wider range in response to reduction of the gate-to-emitter voltage $V_{GE}$. This explains the reason why a semiconductor element (IGBT) performs active operation easily in a power module if the voltage level of a drive signal for driving the semiconductor element is lowered by the drop of a control power source voltage.

Figure 2:
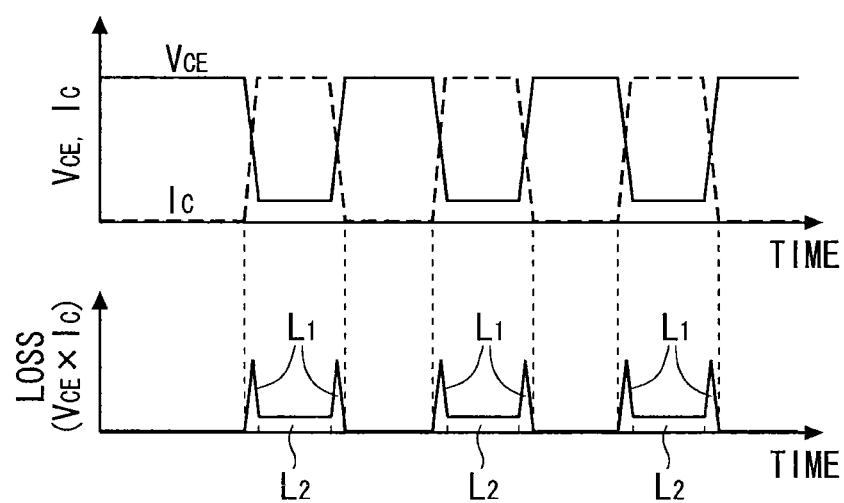
FIG. 2 shows the collector current $I_C$ and the collector-to-emitter voltage $V_{CE}$ of the IGBT, and loss generated in the IGBT that are observed during normal operation of the IGBT.

FIG. 2 shows the waveforms of the collector current $I_C$ and the collector-to-emitter voltage $V_{CE}$ of the IGBT, and change of resultant loss generated in the IGBT that are observed when the IGBT performs normal operation (when the voltage level of a drive signal is significantly high and the IGBT operates in the saturated region). As seen from FIG. 2, during the normal operation of the IGBT, the collector-to-emitter voltage $V_{CE}$ (ON voltage) drops to a sufficiently low value when the IGBT is turned on to cause the collector current $I_C$ to flow. The loss of the IGBT is determined by a sum of a switching loss L1 and a saturation voltage loss L2 (constant loss), and the saturation voltage loss L2 can be suppressed low for the small magnitude of the ON voltage.

Figure 3:
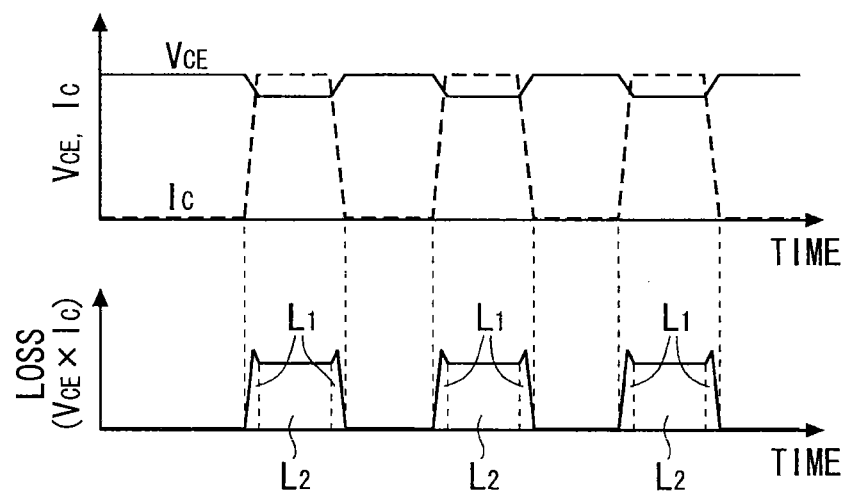
FIG. 3 shows the collector current $I_C$ and the collector-to-emitter voltage $V_{CE}$ of the IGBT, and loss generated in the IGBT that are observed during active operation of the IGBT.

FIG. 3 shows the waveforms of the collector current $I_C$ and the collector-to-emitter voltage $V_{CE}$ of the IGBT, and change of resultant loss generated in the IGBT that are observed when the IGBT performs active operation. During the active operation of the IGBT, the collector-to-emitter voltage $V_{CE}$ (ON voltage) is kept high even when the IGBT is turned on to cause the collector current $I_C$ to flow. This increases the saturation voltage loss L2, and increase of the saturation voltage loss L2 leads to thermal breakdown of the IGBT.

Figure 4:
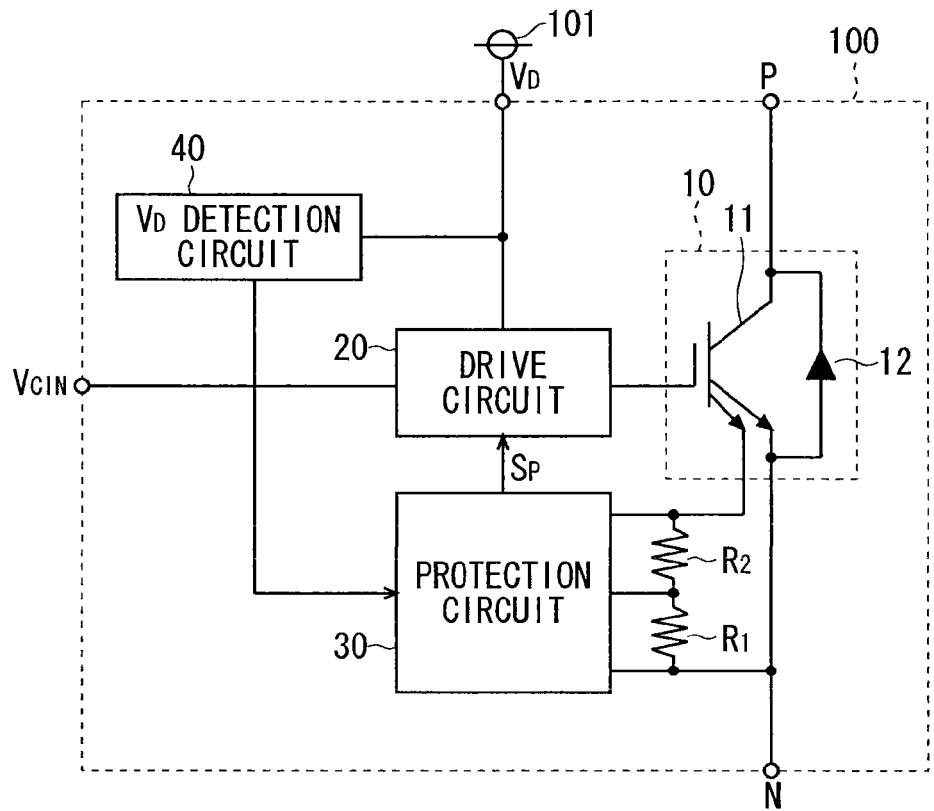
FIG. 4 shows the structure of a power module of a first preferred embodiment.

FIG. 4 shows the structure of a power module 100 of a first preferred embodiment. The power module 100 includes a semiconductor element 10, a drive circuit 20, a protection circuit 30, a control power source voltage detection circuit ($V_D$ detection circuit) 40, and resistors $R_1$ and $R_2$.

The semiconductor element 10 includes an IGBT 11 having a collector and an emitter (main electrodes) connected to P and N terminals respectively, and a diode (antiparallel diode) 12 connected in anti-parallel to the IGBT 11. The IGBT 11 has a sense terminal through which a sense current proportionate to a collector current (main current flowing between the main electrodes) is output. The resistors $R_1$ and $R_2$ functioning as a sense resistor for detecting the collector current are connected in series between the sense terminal and the N terminal (emitter of the IGBT 11).

The drive circuit 20 generates a drive signal to be given to the gate of the IGBT 11 based on an input signal $V_{CIN}$ that is a control signal received from outside. The drive circuit 20 is supplied with a control power source voltage $V_D$ from an external power source 101 connected to an external power source input terminal of the semiconductor element 10. The voltage level of the drive signal for driving the IGBT 11 is determined by the control power source voltage $V_D$. While the external power source 101 is used as an example, the power module 100 may include therein a power source (internal power source) for generating the control power source voltage $V_D$.

The protection circuit 30 detects the collector current of the IGBT 11 based on a sense voltage generated in the sense resistor (resistors $R_1$ and $R_2$). If the collector current reaches an SC trip level, the protection circuit 30 outputs a protection signal $S_P$ instructing operation for protection of the IGBT 11 to the drive circuit 20. In response to receipt of the protection signal $S_P$ from the protection circuit 30, the drive circuit 20 performs predetermined operation for protection. As an example, the drive circuit 20 stops the operation of the IGBT 11.

The control power source voltage detection circuit ($V_D$ detection circuit) 40 detects the level of the control power source voltage $V_D$. If this level drops to a level lower than a predetermined voltage level, the control power source voltage detection circuit 40 outputs a signal indicating the drop of the level to the protection circuit 30.

Figure 5:
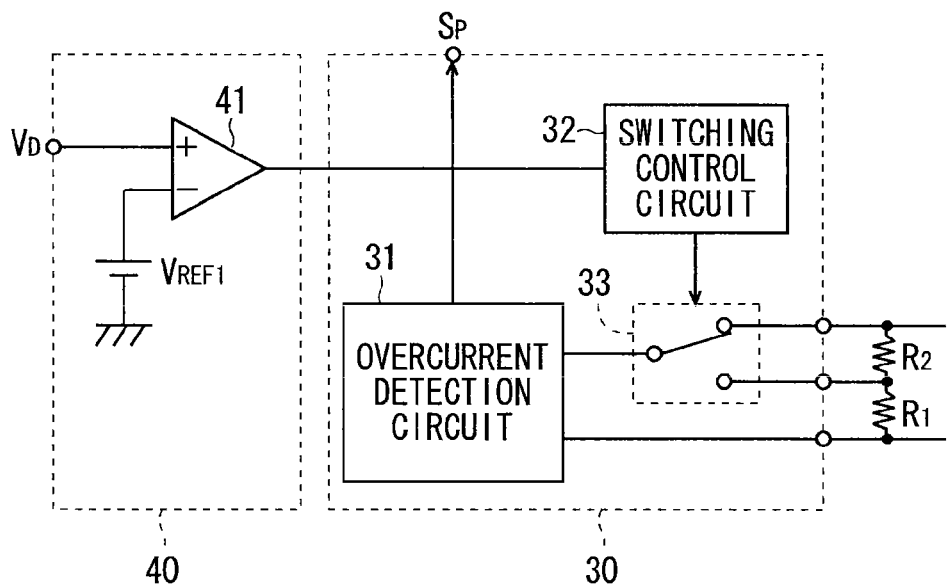
FIG. 5 shows the structures of a protection circuit and a control power source voltage detection circuit in the power module of the first preferred embodiment.

FIG. 5 shows the structures of the protection circuit 30 and the control power source voltage detection circuit 40 in the power module 100 of the first preferred embodiment. The protection circuit 30 is composed of an overcurrent detection circuit 31, a switching control circuit 32, and a switch 33. The control power source voltage detection circuit 40 is composed of a comparator 41.

The overcurrent detection circuit 31 receives the sense voltage generated in the sense resistor (resistors $R_1$ and $R_2$). If the sense voltage has reached a predetermined value, the overcurrent detection circuit 31 determines that the collector current of the IGBT 11 has reached an SC trip level (namely, that an overcurrent flowed in the IGBT 11), and generates the protection signal $S_P$. The overcurrent detection circuit 31 may be the same as an overcurrent detection circuit provided in a conventional power module.

The sense voltage to be applied to the overcurrent detection circuit 31 is selected by the switch 33. As described above, the power module 100 includes a series circuit with the resistors $R_1$ and $R_2$ functioning as the sense resistor. The switch 33 determines if the overcurrent detection circuit 31 is to be connected across the resistor $R_1$, or across the series circuit with the resistors $R_1$ and $R_2$. To be specific, the switch 33 determines if a voltage generated in the resistor $R_1$, or a voltage generated through the series circuit with the resistors $R_1$ and $R_2$, is to be applied as the sense voltage to the overcurrent detection circuit 31. The switching control circuit 32 controls the operation of the switch 33 based on the output of the comparator 41 in the control power source voltage detection circuit 40.

The comparator 41 compares the control power source voltage $V_D$ and a predetermined reference voltage $V_{REF1}$. The reference voltage $V_{REF1}$ is lower than a normal value of the control power source voltage $V_D$. The output of the comparator 41 is at H (high) level in a normal condition where the control power source voltage $V_D$ is higher than the reference voltage $V_{REF1}$, and is at L (low) level if the control power source voltage $V_D$ drops to a level lower than the reference voltage $V_{REF1}$. The switching control circuit 32 controls the switch 33 to make the switch 33 connect the overcurrent detection circuit 31 across the resistor $R_1$ if the output of the comparator 41 is at H level, while making the switch 33 connect the overcurrent detection circuit 31 across the series circuit with the resistors $R_1$ and $R_2$ if the output of the comparator 41 is at L level.

So, in the power module 100 of the first preferred embodiment, the voltage generated in the resistor $R_1$ is applied as the sense voltage to the overcurrent detection circuit 31 if the control power source voltage $V_D$ is at its normal value. Meanwhile, if the control power source voltage $V_D$ drops, the voltage generated through the series circuit with the resistors $R_1$ and $R_2$ is applied as the sense voltage to the overcurrent detection circuit 31. Thus, the drop of the control power source voltage $V_D$ makes the sense voltage to be applied to the overcurrent detection circuit 31 high while the collector current is at a constant level.

As a result, while the control power source voltage $V_D$ is low, the overcurrent detection circuit 31 outputs the protection signal $S_P$ even if the flowing collector current is lower than that flowing when the control power source voltage $V_D$ is at its normal value. To be specific, in the power module 100 of the first preferred embodiment, an SC trip level is lowered if the control power source voltage $V_D$ drops.

So, the control power source voltage detection circuit 40 detects the drop of the control power source voltage $V_D$ to function as active operation detecting means that detects the active operation of the IGBT 11. Further, the switching control circuit 32 and the switch 33 function as a trip level switching circuit that lowers an SC trip level if the control power source voltage $V_D$ is lower than a predetermined value.

As described above, the drop of the control power source voltage $V_D$ lowers the voltage level of a drive signal output from the drive circuit 20, making the IGBT 11 perform active operation to increase the ON voltage thereof. This causes a fear of thermal breakdown of the IGBT 11 to be generated before the collector current reaches a normal SC trip level. However, in the power module 100 of the first preferred embodiment, an SC trip level is lowered if the control power source voltage $V_D$ drops. Thus, even if the flowing collector current is relatively low, the protection circuit 30 outputs the protection signal $S_P$, making it possible to prevent thermal breakdown of the IGBT 11.

Second Preferred Embodiment

FIG. 6 shows the structure of a power module 100 of a second preferred embodiment. The power module 100 of the second preferred embodiment includes a semiconductor element 10, a drive circuit 20, a protection circuit 30, a collector-to-emitter voltage detection circuit ($V_{CE}$ detection circuit) 50, and resistors $R_1$ and $R_2$.

The semiconductor element 10, the drive circuit 20, and the resistors $R_1$ and $R_2$ are the same as those shown in FIG. 4, so they will not be described again. In the second preferred embodiment, the drive circuit 20 is also supplied with a control power source voltage $V_D$ from an external power source 101. Meanwhile, the power module 100 may include therein a power source (internal power source) for generating the control power source voltage $V_D$.

The protection circuit 30 has a structure substantially the same as that shown in FIG. 4. However, the protection circuit 30 differs from the structure shown in FIG. 4 in that the operation of the protection circuit 30 is controlled by the output of the collector-to-emitter voltage detection circuit 50.

The collector-to-emitter voltage detection circuit ($V_{CE}$ detection circuit) 50 detects the collector-to-emitter voltage (main voltage applied between the main electrodes) of the IGBT 11, and outputs a signal indicating if the detected collector-to-emitter voltage is higher than a predetermined value to the protection circuit 30.

FIG. 7 shows the structures of the protection circuit 30 and the collector-to-emitter voltage detection circuit 50 in the power module 100 of the second preferred embodiment. The protection circuit 30 is composed of an overcurrent detection circuit 31, a switching control circuit 32, and a switch 33. The collector-to-emitter voltage detection circuit 50 is composed of a comparator 51.

The structure of the protection circuit 30 is the same as that of the first preferred embodiment (FIG. 5). Further, in the second preferred embodiment, the operation of the switching control circuit 32 for controlling the switch 33 is controlled based on the output of the comparator 51 of the collector-to-emitter voltage detection circuit 50.

The comparator 51 compares the collector-to-emitter voltage of the IGBT 11 (or, a voltage determined by dividing the collector-to-emitter voltage by a certain ratio) and a predetermined reference voltage $V_{REF2}$. The reference voltage $V_{REF2}$ is higher than the ON voltage (or a voltage determined by dividing the ON voltage) of the IGBT 11 applied when the IGBT 11 performs normal operation (or a voltage determined by dividing the ON voltage). The collector-to-emitter voltage is low if the IGBT 11 is turned on to start normal operation, placing the output of the comparator 51 at L level. Meanwhile, if the IGBT 11 is turned on to start active operation, the collector-to-emitter voltage does not drop despite the flow of a collector current (see FIG. 3). So, the output of the comparator 51 is kept at H level.

The switching control circuit 32 controls the switch 33 to make the switch 33 connect the overcurrent detection circuit 31 across the resistor $R_1$ if the output of the comparator 51 is at L level, while making the switch 33 connect the overcurrent detection circuit 31 across a series circuit with the resistors $R_1$ and $R_2$ if the output of the comparator 51 is at H level.

So, in the power module 100 of the second preferred embodiment, a voltage generated in the resistor $R_1$ is applied as a sense voltage to the overcurrent detection circuit 31 if the IGBT 11 is turned on to start normal operation. Meanwhile, if the IGBT 11 is turned on to start active operation and if the IGBT is in OFF, a voltage generated through the series circuit with the resistors $R_1$ and $R_2$ is applied as the sense voltage to the overcurrent detection circuit 31. Thus, if the IGBT 11 is turned on to start active operation while the collector current is at a constant level, the sense voltage to be applied to the overcurrent detection circuit 31 is higher than that applied if the IGBT 11 is turned on to start normal operation.

As a result, if the IGBT 11 is turned on to start active operation, the overcurrent detection circuit 31 outputs a protection signal $S_P$ even if the flowing collector current is lower than that flowing if the IGBT 11 is turned on to start normal operation. To be specific, in the power module 100 of the second preferred embodiment, an SC trip level is lowered if the IGBT 11 is turned on to start active operation.

So, the collector-to-emitter voltage detection circuit 50 detects that the collector-to-emitter voltage $V_{CE}$ (main voltage) is higher than a predetermined value to function as active operation detecting means that detects the active operation of the IGBT 11. Further, the switching control circuit 32 and the switch 33 function as a trip level switching circuit that lowers an SC trip level if the collector-to-emitter voltage $V_{CE}$ is higher than the predetermined value.

In the power module 100 of the second preferred embodiment, an SC trip level is lowered if the control power source voltage $V_D$ drops to make the IGBT 11 perform active operation. Thus, even if the flowing collector current is relatively low, the protection circuit 30 outputs the protection signal $S_P$. This allows the drive circuit 20 to perform predetermined operation for protection before the IGBT 11 is thermally broken, making it possible to prevent thermal breakdown of the IGBT 11.

In the first preferred embodiment, the active operation of the IGBT 11 is predicted based on the drop of the control power source voltage $V_D$. In the second preferred embodiment, an SC trip level is lowered by detecting the actual active operation of the IGBT 11. This achieves an effect in that the operation of the IGBT 11 will not be stopped unnecessarily.

Third Preferred Embodiment

Figure 8:
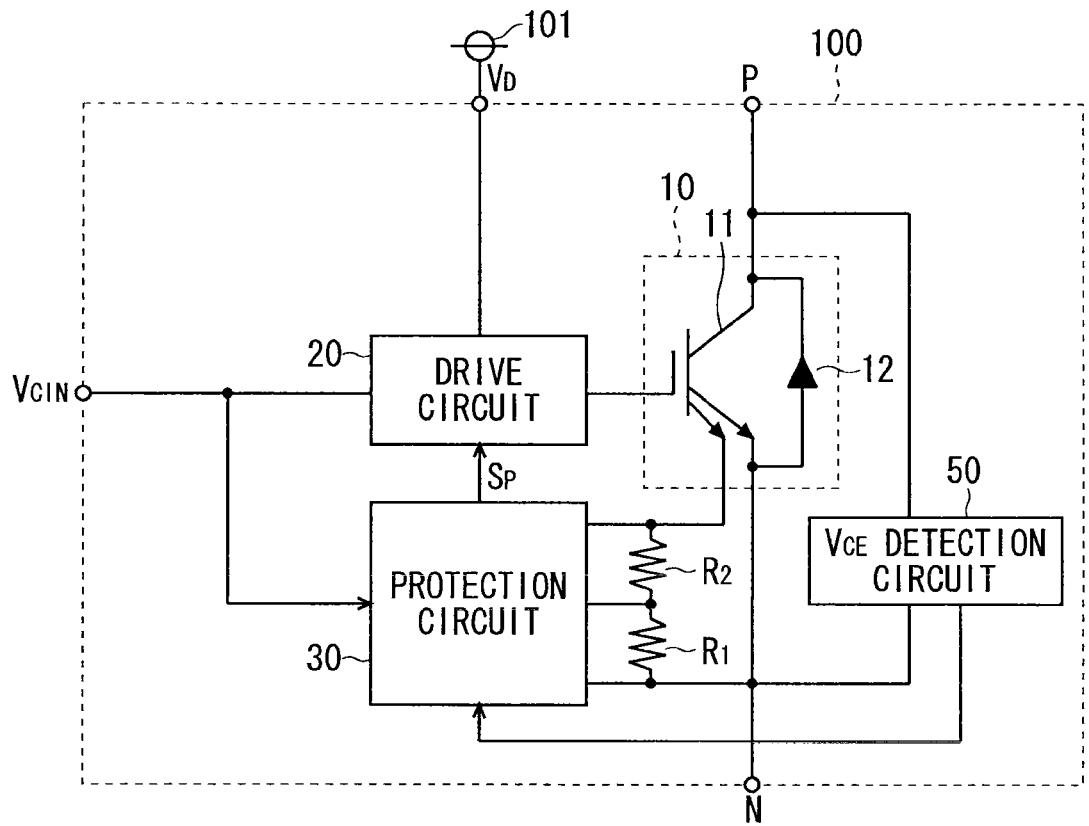
FIG. 8 shows the structure of a power module of a third preferred embodiment.
Figure 9:
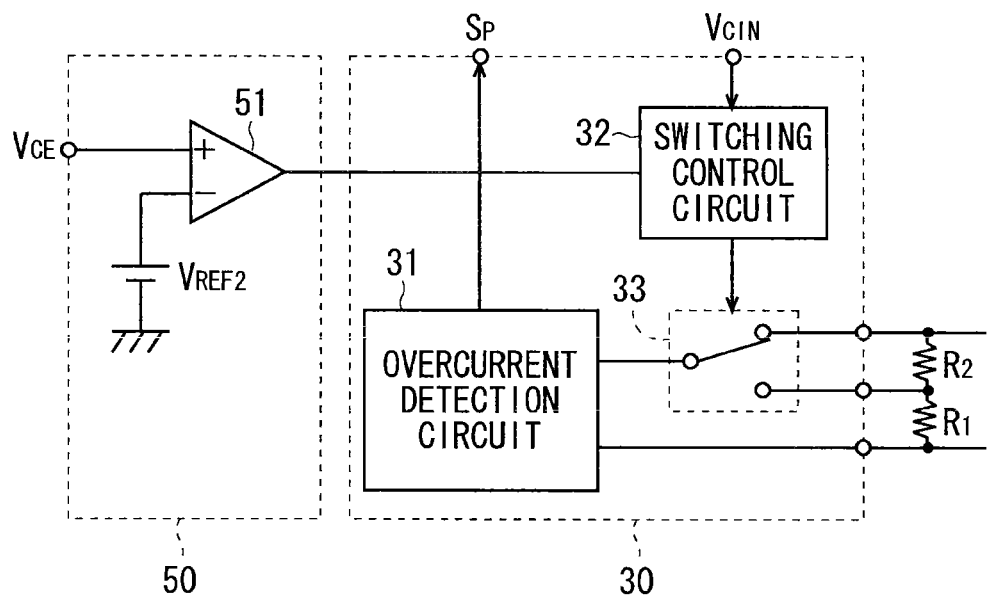
FIG. 9 shows the structures of a protection circuit and a collector-to-emitter voltage detection circuit in the power module of the third preferred embodiment.

FIG. 8 shows the structure of a power module 100 of a third preferred embodiment. FIG. 9 shows the structures of a protection circuit 30 and a collector-to-emitter voltage detection circuit 50 in the power module 100 of the third preferred embodiment.

The structure of the power module 100 of the third preferred embodiment is the same as that of the second preferred embodiment (FIGS. 6 and 7), except for that an input signal $V_{CIN}$ is given not only to a drive circuit 20 but also to a switching control circuit 32 of the protection circuit 30. It is assumed here that the drive circuit 20 operates in a manner that turns an IGBT 11 on if the input signal $V_{CIN}$ is at H level, and turns the IGBT 11 off if the input signal $V_{CIN}$ is at L level.

Like that of the second preferred embodiment, a comparator 51 compares the collector-to-emitter voltage of the IGBT 11 (or, a voltage determined by dividing the collector-to-emitter voltage by a certain ratio) and a predetermined reference voltage $V_{REF2}$. The collector-to-emitter voltage is low if the IGBT 11 is turned on to start normal operation, placing the output of the comparator 51 at L level. Meanwhile, if the IGBT 11 is turned on to start active operation, the collector-to-emitter voltage does not drop despite the flow of a collector current (see FIG. 3). So, the output of the comparator 51 is kept at H level.

Based on the input signal $V_{CIN}$ and the output of the comparator 51, the switching control circuit 32 detects a condition where the collector-to-emitter voltage does not drop even in a period (ON period) from when the input signal $V_{CIN}$ is placed at H level to when the IGBT 11 is turned on. If detecting this condition, the switching control circuit 32 determines that the IGBT 11 has performed active operation, and then lowers an SC trip level. More specifically, the switching control circuit 32 controls the switch 33 to make the switch 33 connect the overcurrent detection circuit 31 across a series circuit with resistors $R_1$ and $R_2$ if both the input signal $V_{CIN}$ and the output of the comparator 51 are at H level, while making the switch 33 connect the overcurrent detection circuit 31 across the resistor $R_1$ in other cases.

In the second preferred embodiment, an SC trip level is high only if the IGBT 11 is turned on to start normal operation to reduce the collector-to-emitter voltage. The SC trip level is low in other cases (if the IGBT 11 is turned on to start active operation and if the IGBT 11 is in OFF).

In contrast, in the third preferred embodiment, an SC trip level is low only if the IGBT 11 is turned on to start active operation, and is kept high in other cases (if the IGBT 11 is turned on to start normal operation and if the IGBT 11 is in OFF). So, the third preferred embodiment does not set an SC trip level at an unnecessarily low level, making it possible to detect the active operation of the IGBT 11 more accurately than the second preferred embodiment. As a result, the operation of the IGBT 11 will not be stopped unnecessarily.

Fourth Preferred Embodiment

Figure 10:
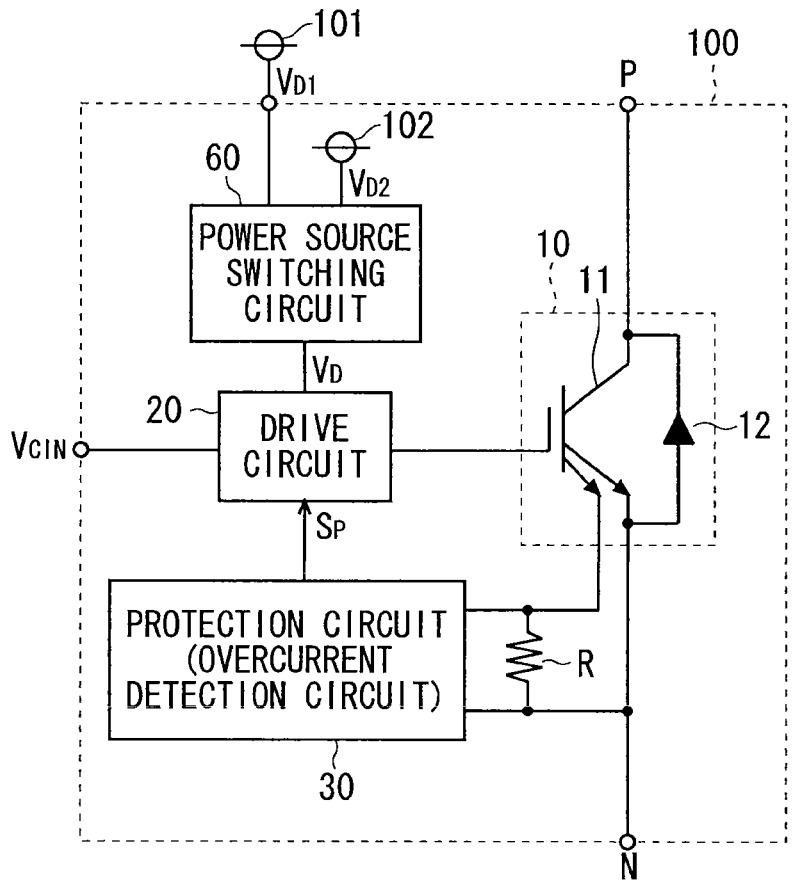
FIG. 10 shows the structure of a power module of a fourth preferred embodiment.

FIG. 10 shows the structure of a power module 100 of a fourth preferred embodiment. The power module 100 of the fourth preferred embodiment includes a semiconductor element 10, a drive circuit 20, a protection circuit 30, a power source switching circuit 60, a resistor R functioning as a sense resistor, and an internal power source 102. The semiconductor element 10 and the drive circuit 20 are the same as those shown in FIG. 4, so they will not be described again.

The protection circuit 30 of the fourth preferred embodiment may be the same as a protection circuit provided in a conventional power module (as an example, it may be the same as the overcurrent detection circuit 31 shown in the first to third preferred embodiments). If a sense voltage generated in the resistor R has reached a predetermined value, the protection circuit 30 determines that the collector current of an IGBT 11 has reached an SC trip level. Then, the protection circuit 30 generates a protection signal $S_P$, and supplies the protection signal $S_P$ to the drive circuit 20.

The power module 100 of the fourth preferred embodiment is supplied with a control power source voltage $V_{D1}$ given from an external power source 101 connected to an external power source input terminal of the power module 100. Further, the power module 100 includes therein the internal power source 102 for generating a control power source voltage $V_{D2}$. In the below, the control power source voltage $V_{D1}$ supplied from the external power source 101 is called an "external power source voltage," and the control power source voltage $V_{D2}$ generated by the internal power source 101 is called an "internal power source voltage." The external and internal power source voltages $V_{D1}$ and $V_{D2}$ are applied to the power source switching circuit 60.

The power source switching circuit 60 selects one of the external and internal power source voltages $V_{D1}$ and $V_{D2}$, and supplies the selected one as the control power source voltage $V_D$ to the drive circuit 20. More specifically, the external power source voltage $V_{D1}$ is normally supplied to the drive circuit 20. Meanwhile, if the external power source voltage $V_{D1}$ drops, the power source switching circuit 60 changes the external power source voltage $V_{D1}$ to the internal power source voltage $V_{D2}$, and then supplies the internal power source voltage $V_{D2}$ to the drive circuit 20.

Figure 11:
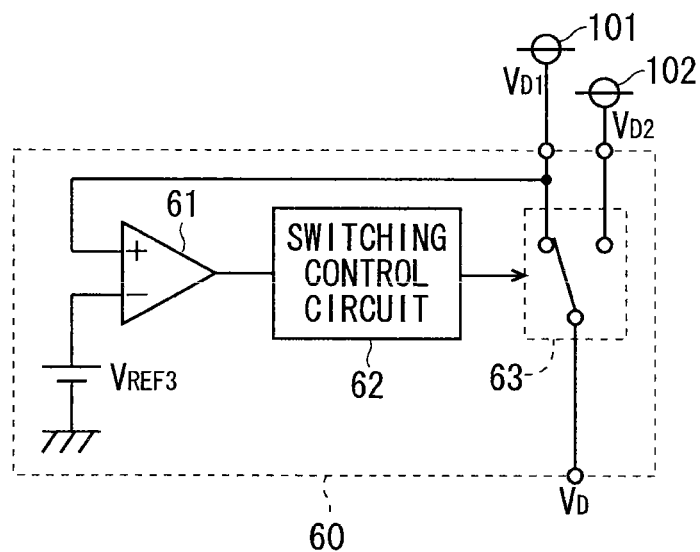
FIG. 11 shows the structure of a power source switching circuit in the power module of the fourth preferred embodiment.

FIG. 11 shows the structure of the power source switching circuit 60 in the power module 100 of the fourth preferred embodiment. The power source switching circuit 60 is composed of a comparator 61, a switching control circuit 62, and a switch 63.

The switch 63 determines if the external power source voltage $V_{D1}$ or the internal power source voltage $V_{D2}$ is to be supplied as the control power source voltage $V_D$ to the drive circuit 20. The switching control circuit 62 controls the operation of the switch 63 based on the output of the comparator 61.

The comparator 61 compares the external power source voltage $V_{D1}$ and a predetermined reference voltage $V_{REF3}$. The reference voltage $V_{REF3}$ is lower than a normal value of the external power source voltage $V_{D1}$. The output of the comparator 61 is at H level in a normal condition where the external power source voltage $V_{D1}$ is higher than the reference voltage $V_{REF3}$, and is at L level if the external power source voltage $V_{D1}$ drops to a level lower than the reference voltage $V_{REF3}$. The switching control circuit 62 controls the switch 63 to supply the external power source voltage $V_{D1}$ to the drive circuit 20 if the output of the comparator 61 is at H level, while supplying the internal power source voltage $V_{D2}$ to the drive circuit 20 if the output of the comparator 61 is at L level.

Thus, in the power module 100 of the fourth preferred embodiment, the external power source voltage $V_{D1}$ is normally used as the control power source voltage $V_D$. Meanwhile, if the external power source voltage $V_{D1}$ drops, the internal power source voltage $V_{D2}$ takes the place of the external power source voltage $V_{D1}$ as a voltage to be used as the control power source voltage $V_D$. This prevents the active operation itself of the IGBT 11 to be caused by the drop of the control power source voltage $V_D$ supplied to the drive circuit 20, making it possible to prevent thermal breakdown of the IGBT 11.

Fifth Preferred Embodiment

Figure 12:
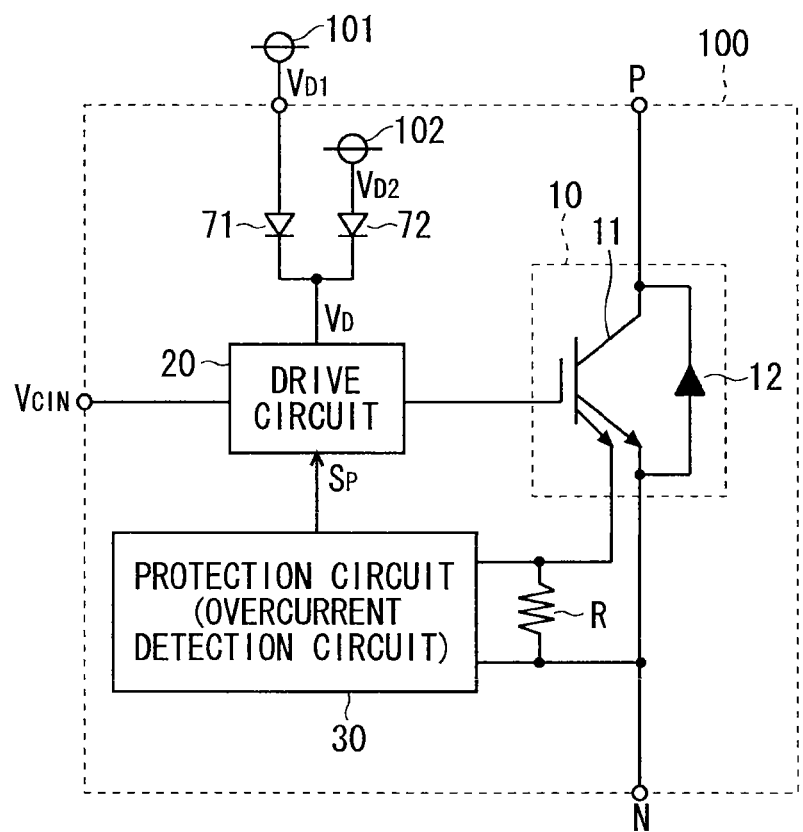
FIG. 12 shows the structure of a power module of a fifth preferred embodiment.

FIG. 12 shows the structure of a power module 100 of a fifth preferred embodiment. The power module 100 of the fifth preferred embodiment includes a semiconductor element 10, a drive circuit 20, a protection circuit 30, a resistor R functioning as a sense resistor, diodes 71 and 72 being unidirectional elements, and an internal power source 102.

The structure of the power module 100 of the fifth preferred embodiment is the same as that of the fourth preferred embodiment (FIGS. 10 and 11), except for that the diodes 71 and 72 take the place of the power source switching circuit 60.

An external power source 101 is connected through the diode 71 to a power source input terminal of the drive circuit 20 through which a control power source voltage $V_D$ is applied to the drive circuit 20. The internal power source 102 is also connected through the diode 72 to the power source input terminal. The cathodes of the diodes 71 and 72 are connected to the power source input terminal of the drive circuit 20.

So, one of external and internal power source voltages $V_{D1}$ and $V_{D2}$ having a higher value than the other is supplied as the control power source voltage $V_D$ to the drive circuit 20. To be specific, in the fifth preferred embodiment, the internal power source voltage $V_{D2}$ is used as the control power source voltage $V_D$ if the external power source voltage $V_{D1}$ drops. Meanwhile, the external power source voltage $V_{D1}$ is used as the control power source voltage $V_D$ if the internal power source voltage $V_{D2}$ drops.

Thus, like the fourth preferred embodiment, the fifth preferred embodiment is capable of preventing the active operation itself of an IGBT 11 to be caused by the drop of the control power source voltage $V_D$ supplied to the drive circuit 20, making it possible to prevent thermal breakdown of the IGBT 11. In addition, the structure of the power module 100 is simpler than that of the fourth preferred embodiment (FIGS. 10 and 11), allowing cost reduction of the power module 100.

<Modifications>

In each of the embodiments described above, the semiconductor element 10 is composed of the IGBT 11 and the antiparallel diode 12 connected to the IGBT 11. However, this is not the only structure of the semiconductor element 10. As an example, a MOSFET or a bipolar transistor may take the place of the IGBT 11 to function as a switching element. Also, the semiconductor element 10 may include an RC-IGBT (reverse-conducting insulated gate bipolar transistor) in which an antiparallel diode is provided.

A switching element (including an RC-IGBT) and a diode of the semiconductor element 10 may be formed of silicon (Si), or a wide bandgap semiconductor such as silicon carbide (SiC). Not only SiC but also a gallium nitride (GaN) based material or diamond may be used as a wide bandgap semiconductor.

The semiconductor element 10 has a high breakdown voltage and can increase the admissible value of a current density if it is formed by using a wide bandgap semiconductor. This allows size reduction of the semiconductor element 10, contributing to size reduction of the power module 100. Regarding use of a wide bandgap semiconductor, both, or one of the switching element and the diode may be made of a wide bandgap semiconductor.

The preferred embodiments of the present invention can be combined freely, or each of the preferred embodiments can be modified or omitted where appropriate without departing from the scope of the present invention.

While the invention has been shown and described in detail, the foregoing description is in all aspects illustrative and not restrictive. It is therefore understood that numerous modifications and variations can be devised without departing from the scope of the invention.

What is claimed is:

1. A power module, comprising:
   a semiconductor element;
   a drive circuit for driving said semiconductor element based on a control power source voltage;
   a protection circuit for detecting a main current flowing between main electrodes of said semiconductor element, and performing operation for protection of said semiconductor element if the main current has reached a trip level;
   an active operation detection part for detecting a variation of the control power source voltage resulting in active operation of said semiconductor element; and
   a trip level switching circuit for lowering said trip level if the variation of the control power source voltage resulting in the active operation of said semiconductor element is detected.

2. The power module according to claim 1, wherein
   said active operation detection part is a control power source voltage detection circuit for detecting the drop of a control power source voltage to be supplied to said drive circuit to a level lower than a predetermined value, and
   said trip level switching circuit lowers said trip level if said control power source voltage is lower than said predetermined value.

3. The power module according to claim 1, wherein
   said active operation detection part is a main voltage detection circuit for detecting that a main voltage applied between said main electrodes of said semiconductor element is higher than a predetermined value, and said trip level switching circuit lowers said trip level if said main voltage is higher than said predetermined value.

4. The power module according to claim 3, wherein said trip level switching circuit detects an ON period of said semiconductor element based on a control signal from said drive circuit, and lowers said trip level if said semiconductor element is in the ON period and said main voltage is higher than said predetermined value.

5. The power module according to claim 1, wherein said semiconductor element includes any one of an IGBT, an RC-IGBT, a MOSFET, and a bipolar transistor.

6. The power module according to claim 1, wherein said semiconductor element includes a switching element made of a wide bandgap semiconductor.

7. The power module according to claim 1, wherein
said semiconductor element includes a switching element and a diode connected in anti-parallel to the switching element, and
at least one of said switching element and said diode is made of a wide bandgap semiconductor.

* * * * *